(12) United States Patent
Bold et al.

(10) Patent No.: US 9,388,839 B2
(45) Date of Patent: Jul. 12, 2016

(54) RELEASE LATCH

(71) Applicant: Hewlett-Packard Development Company, L.P., Houston, TX (US)

(72) Inventors: Kevin P. Bold, Houston, TX (US); Kevin D. Conn, Montgomery, TX (US); Keith A. Sauer, Spring, TX (US); Minh H. Nguyen, Katy, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 195 days.

(21) Appl. No.: 13/951,997

(22) Filed: Jul. 26, 2013

(65) Prior Publication Data

US 2015/0027969 A1   Jan. 29, 2015

(51) Int. Cl.
*F16B 21/06* (2006.01)
*H05K 7/14* (2006.01)

(52) U.S. Cl.
CPC .............. *F16B 21/06* (2013.01); *H05K 7/1489* (2013.01); *Y10T 403/591* (2015.01)

(58) Field of Classification Search
CPC ........ F16B 21/06; F16B 21/065; F16B 21/07; F16B 21/08; F16B 21/09; A47B 88/00; A47B 88/04; A47B 96/06; H05K 7/1488; H05K 7/1491
USPC .................................. 211/26, 26.2; 312/334.4
See application file for complete search history.

(56) References Cited

U.S. PATENT DOCUMENTS

| | | | |
|---|---|---|---|
| 6,702,124 B2 | 3/2004 | Lauchner et al. | |
| 6,935,521 B2 * | 8/2005 | Gundlach et al. | 211/183 |
| 7,137,512 B2 | 11/2006 | Nguyen et al. | |
| 7,192,103 B2 | 3/2007 | Hamilton | |
| 7,357,362 B2 * | 4/2008 | Yang et al. | 248/221.11 |
| 7,552,899 B2 * | 6/2009 | Chen et al. | 248/224.8 |
| 7,703,734 B2 * | 4/2010 | Chen et al. | 248/298.1 |
| 7,744,177 B2 * | 6/2010 | Peng et al. | 312/334.4 |
| 8,079,654 B2 * | 12/2011 | Yu et al. | 312/334.4 |
| 8,231,188 B1 * | 7/2012 | Chen et al. | 312/333 |
| 8,371,454 B2 * | 2/2013 | Chen et al. | 211/26 |
| 8,662,607 B2 * | 3/2014 | Fan et al. | 312/333 |
| 8,807,351 B2 * | 8/2014 | Lin et al. | 211/26 |
| 2003/0107309 A1 * | 6/2003 | Lauchner | 312/334.5 |
| 2005/0274680 A1 * | 12/2005 | Allen et al. | 211/26 |
| 2008/0067907 A1 * | 3/2008 | Chen et al. | 312/312 |
| 2008/0078899 A1 * | 4/2008 | Chen et al. | 248/220.21 |
| 2008/0203251 A1 * | 8/2008 | Chen et al. | 248/200 |
| 2010/0200523 A1 | 8/2010 | Henderson | |
| 2011/0290746 A1 * | 12/2011 | Lu | 211/26 |
| 2012/0057812 A1 | 3/2012 | Judge et al. | |

FOREIGN PATENT DOCUMENTS

TW    M244713    9/2004

OTHER PUBLICATIONS

Unknown., "Installing and Using Your Sun X4500-J Slide Rails", Retrieved from http://docs.oracle.com/cd/E19469-01/820-7238-10/chap1-hw.html, 2009, 15 pages.
Unknown., "Battery", Retrieved from http://pic.dhe.ibm.com/infocenter/powersys/v3r1m5/index.jsp?topic=/p7ed6/arebsrackbattery.htm, Aug. 22, 2012, 15 pages.
Unknown., "Mounting 1U Series xx50 in a Rack", Retrieved from https://supportstaging.riverbed.com/doc/steelhead/8.0/html/rack_install/wwhelp/wwhimpl/common/html/wwhelp.htm#href=xx50.5.3.html&single=true, Jun. 2013, 8 pages.

* cited by examiner

*Primary Examiner* — Joshua Rodden
(74) *Attorney, Agent, or Firm* — Brooks, Cameron & Huebsch, PLLC

(57) ABSTRACT

A release latch apparatus can include a locking mechanism coupled to a first position of a rocker and a spring mechanism coupled to a second position of the rocker.

15 Claims, 5 Drawing Sheets

RELEASE LATCH

BACKGROUND

A data center can include a plurality of racks to store a plurality of servers. The plurality of racks can each include a plurality of rails that can enable a user to attach the plurality of servers to the racks and/or remove the plurality of servers from the racks. The rails can be used to move the plurality of servers into the racks and/or remove the plurality of servers from the rack.

DETAILED DESCRIPTION

Figure 1:
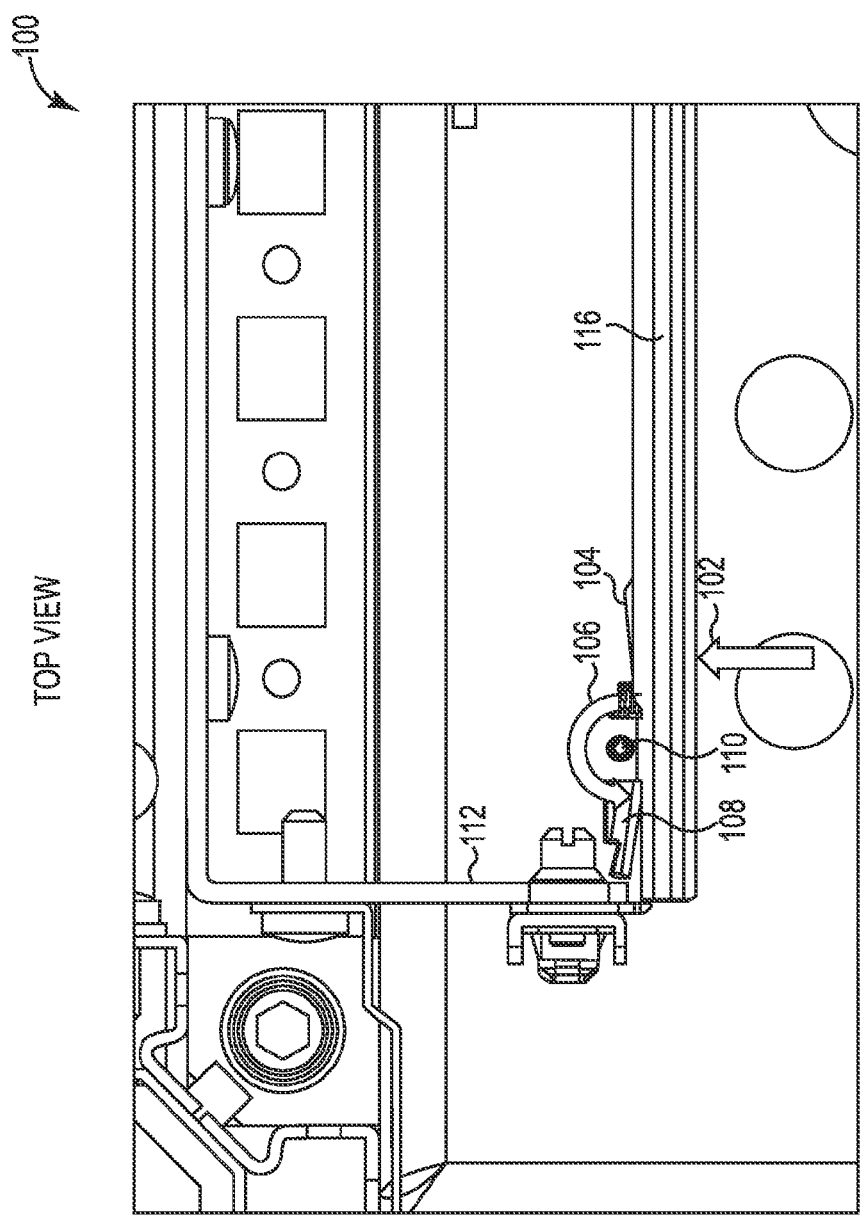
FIG. 1 illustrates a diagram of an example of a top view of a locked release latch.

A release latch in accordance with the present disclosure can release a rail (e.g., server rail, rail attached to a server, etc.) from a rack (e.g., server rack, device capable of storing a server, etc.) when the rack includes a plurality of other servers. That is, a server attached to a rail that is located within a rack can be removed from the rack when there are other servers located within the same rack. A release latch can include a locking mechanism and a spring mechanism located on a rocker (e.g., pivot, cylindrical piece to enable pivoting, etc.). The locking mechanism can be located at a first position on the rocker. In addition the spring mechanism can be located at a second position on the rocker. For example, the locking mechanism can be located on a first side of the rocker and the spring mechanism can located on a second side of the rocker.

The locking mechanism can be in an enabled position (e.g., locked position, position that locks the rail to the rack, etc.) when the spring mechanism is in a first position. The locking mechanism can be in a disabled position (e.g., unlocked position, position that unlocks the rail from the rack, position that enables a user to release the rail from the rack, etc.) when the spring is in a second position.

The spring mechanism can be in the first position corresponding to the locking mechanism being in an enabled position when the spring mechanism is not engaged by a user (e.g., not pressed, no added pressure, etc.). The spring mechanism can be in the second position corresponding to the locking mechanism being in a disabled position when the spring mechanism is engaged by the user (e.g., added pressure, pushing spring with a button, etc.). The spring mechanism can apply pressure to the locking mechanism by utilizing the rocker. For example, the spring mechanism can keep the locking mechanism in the enabled position until a user engages the spring mechanism to disable the locking mechanism.

The spring mechanism can be accessed (e.g., capable of being placed in the first position and/or second position, etc.) by a user without an additional tool (e.g., screwdriver, etc.). For example, the spring mechanism can be accessed utilizing a button that can be accessed to release a single server from a rack that includes a plurality of servers surrounding the single server. It can be advantageous to enable access to the release latch so that particular servers can be released from the rack when the rack includes a plurality of other servers. In addition, it can be advantageous to have a release latch that can be accessed and operable without the use of additional tools.

In the following detailed description of the present disclosure, reference is made to the accompanying drawings that form a part hereof, and in which is shown by way of illustration how examples of the disclosure can be practiced. These examples are described in sufficient detail to enable those of ordinary skill in the art to practice the examples of this disclosure, and it is to be understood that other examples can be utilized and that process, electrical, and/or structural changes can be made without departing from the scope of the present disclosure.

As used herein, "a" or "a number of" something can refer to one or more such things. For example, "a number of servers" can refer to one or more servers.

FIG. 1 illustrates a diagram of an example of a top view of a locked release latch 100. The release latch 100 can include a number of features (e.g., rocker 110, spring mechanism 104, locking mechanism 108, button attached to spring mechanism 104, etc.). The release latch 100 can include a rocker 110 that can be attached to a rail 116. The release latch 100 can include a spring mechanism 104 on a first side of the rocker 110 and a locking mechanism 108 on a second side of the rocker 110.

The spring mechanism 104 can be a leaf spring (e.g., spring with an arch, etc.) that can be attached to the rail 116 at a first position and attached to the rocker 110 at a second position. The spring mechanism 104 can apply a pressure applied to the rocker 110. The pressure to the rocker 110 can be transferred to the locking mechanism 108. The pressure that is transferred to the locking mechanism 108 can put the locking mechanism 108 in a particular position (e.g., locked position, etc.).

The spring mechanism 104 can apply a pressure to the rocker 110 that can keep the locking mechanism 108 in a locked position. The locked position can include the locking mechanism being in a position that interacts with a rack 112. For example, the locking mechanism can be in a position that can prevent the rail 116 from being removed from the rack 112 by hitting the rack 112 if an attempt is made by a user to remove the rail 116.

The locking mechanism 108 can be attached to the rocker 110 and/or part of the rocker 110. The locking mechanism 108 can be affected by pressure applied to the rocker 110 from the spring mechanism 104. For example, the spring mechanism 104 can apply pressure to the rocker 110, and the rocker 110 can transfer the applied pressure to the locking mechanism 108. In this example, the applied pressure can engage the locking mechanism 108 and put the locking mechanism 108 in a position that can interact with the rack 112. The locking mechanism 108 interacting with the rack 112 can include the locking mechanism 108 making contact with the rack 112 and/or preventing the rail 116 from being removed from the rack 112.

A user can interact with the spring mechanism 104 at position 102 via a button (not illustrated in FIG. 1). Position 102 can include a button that can interact with the spring mechanism 104 by applying pressure to the spring mechanism 104. For example, the user can interact with the spring mechanism 104 at position 102 by applying pressure to the button and changing the position of the spring mechanism 104. In this example, the changed position of the spring mechanism 104 can change the pressure applied to the rocker 110 and the pressure applied to the locking mechanism 108. The locking mechanism 108 can change position in the direction of arrow 106. That is, the changed pressure that is applied to locking mechanism 108 can change the position of the locking mechanism 108 to a disabled position (e.g., unlocked position, position to remove the rail 116, etc.).

The rail 116 can be removed by the user when the locking mechanism 108 is in the disabled position. That is, the locking mechanism 108 can pass by the rack 112 when the locking mechanism 108 is in the disabled position. This can enable a user to remove the rail 116 from the rack 112.

The button can be in a position to enable a user to disable the locking mechanism 108 and release the rail 116 from a rack. For example, the button can be located at a position that can be accessed by a user when there are multiple other servers located within the rack. In this example, the multiple other servers can be located at positions that are near and/or next to a server attached to the rail 116. Release latch 100 can be advantageous to users of a server rack. For example, the release latch 100 can be accessed by a user without the use of additional tools when there are multiple other servers located within the rack.

Figure 2:
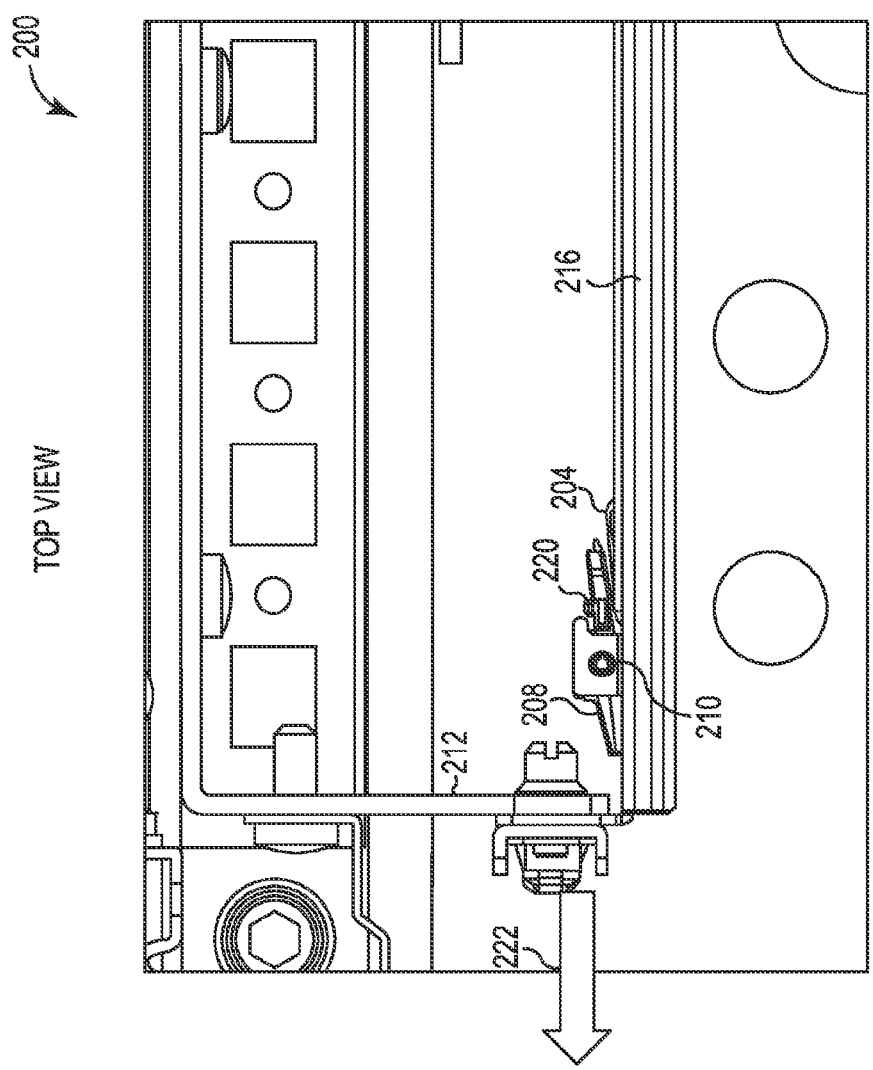
FIG. 2 illustrates a diagram for an example of a top view of an unlocked release latch.

FIG. 2 illustrates a diagram for an example of a top view of an unlocked release latch 200. The release latch 200 can include the features of release latch 100 as referenced in FIG. 1.

In the example illustrated in FIG. 2, spring mechanism 204 is under pressure (e.g., via pressure applied to a button, etc.). As described herein, pressure applied to the spring mechanism 204 via a button can be transferred to the locking mechanism 208 via the rocker 210. The pressure transferred to the locking mechanism 208 can put the locking mechanism in a disabled position. When the locking mechanism 208 is in a disabled position, the rail 216 can be removed from the rack 212 in the direction of arrow 222.

The release latch 200 can include a lock 220 that can be engaged when the locking mechanism 208 is in a particular position (e.g., fully-depressed, disabled position, etc.). For example, the lock 220 can be engaged and can lock the locking mechanism in a fully-depressed position to enable a user to remove the rail 216 from the rack 212. In this example, a user can put pressure on a button (not illustrated in FIG. 2) that can change the position of the spring mechanism 204. In addition, the lock 220 can hold the position of the spring mechanism 208 to apply pressure on the locking mechanism 208 to hold the position of the locking mechanism 208 in a disabled position.

Figure 3:
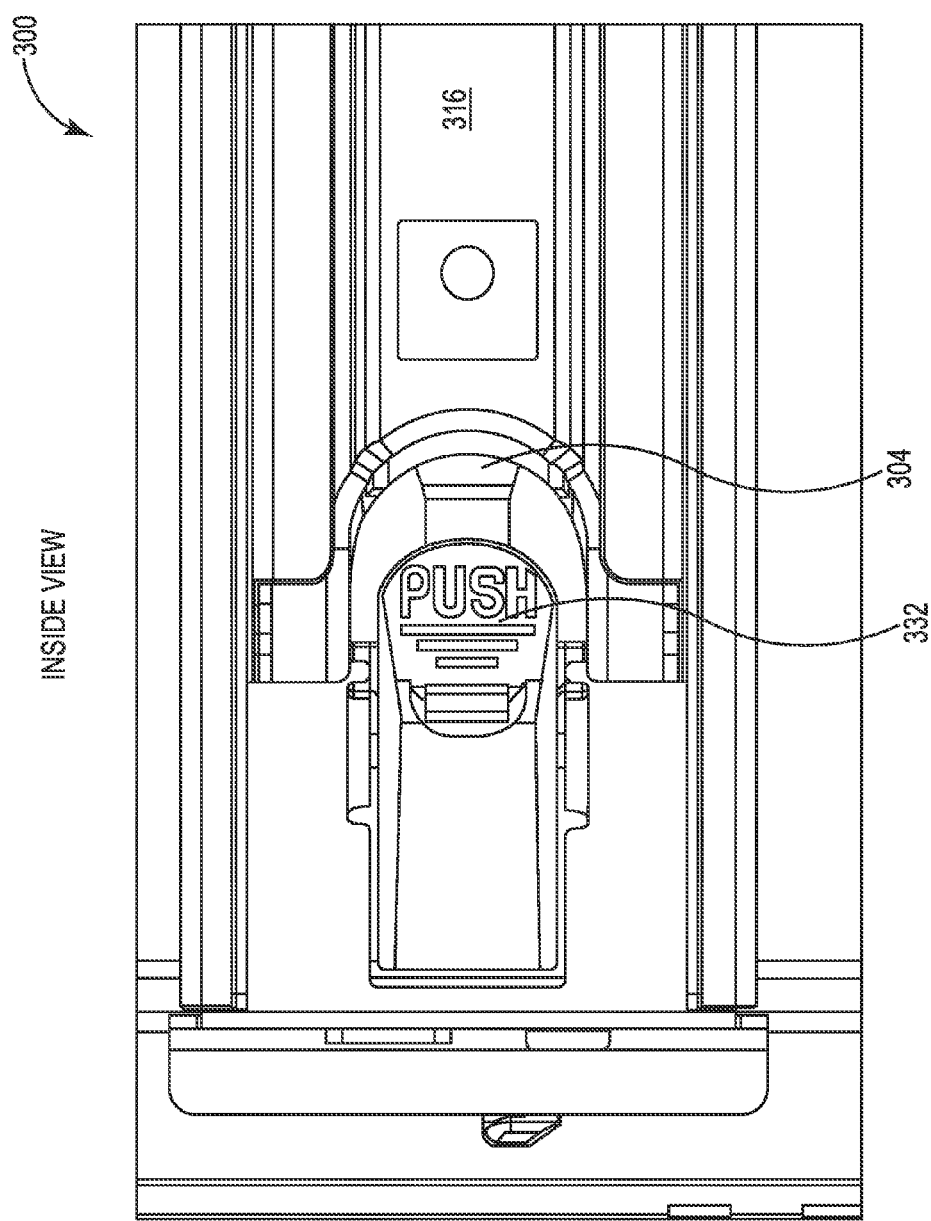
FIG. 3 illustrates a diagram for an example of an inside view of a release latch.

FIG. 3 illustrates a diagram for an example of an inside view of a release latch 300. The inside view of the release latch 300 can include a spring mechanism 304. As described herein, the spring mechanism 304 can be attached to a rocker and a rail 316. The rocker can be on a different side (e.g., outside view, etc.) compared to the button 332. That is, the spring mechanism 304 can be attached to the rail 316 at one end and attached to the rocker behind the button 332 at a second end.

A user can apply pressure to the button 332 to change a position of the spring mechanism 304 and apply pressure to change a position of a locking mechanism. The locking mechanism position can be changed to a position that disables the locking mechanism and releases the rail 316 from the rack. For example, the locking mechanism can be in a position that enables a user to remove the rail 316 from the rack.

The button 332 can be located in a position on the rail 316 that can be accessed by a user when a server is connected to the rail 316. For example, the button 332 can be located on an inside portion of the rail 316 that can be accessed by a user when a server is connected to the rail 316 and placed in a position within the rack. The button 332 can be located in a position on the rail 316 that can be accessed by the user when there are multiple other servers within the rack. For example, multiple other servers can be in a locked position within the rack.

Figure 4:
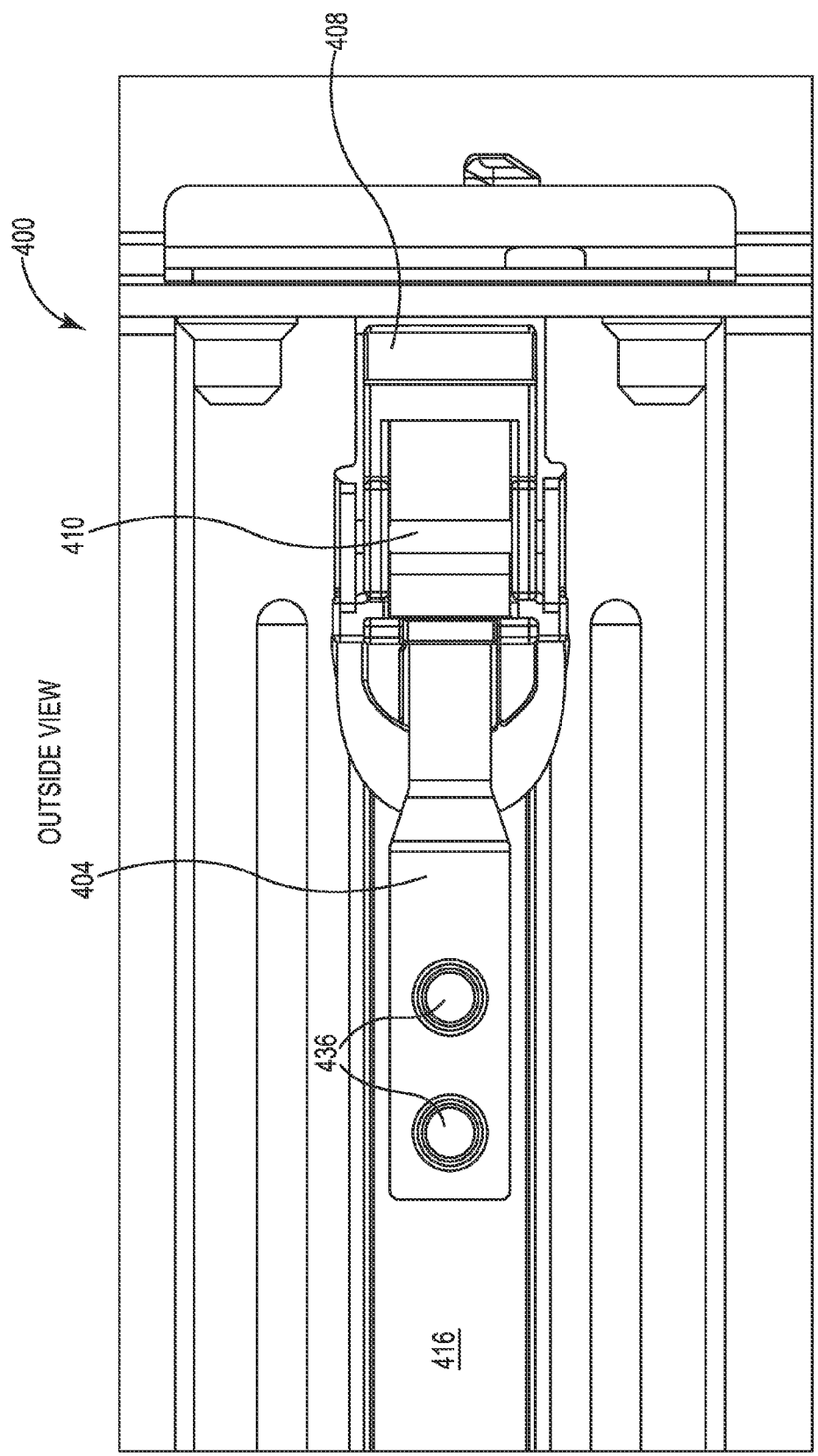
FIG. 4 illustrates a diagram for an example of an outside view of a release latch.

FIG. 4 illustrates a diagram for an example of an outside view of a release latch 400. The release latch 400 can include the same and/or similar features as the release latch 100 as referenced in FIG. 1. The release latch 400 can include a spring mechanism 404 that can be attached to a rail 416 at position 436.

As described herein, the spring mechanism 404 can be a leaf spring mechanism (e.g., material positioned with an arch, aluminum bent to apply pressure, etc.) that can apply pressure to a rocker 410 and place a locking mechanism 408 in a particular position. For example, the spring mechanism 404 can be attached to the rocker 410 at a different position than a button (e.g., button 332 as referenced in FIG. 3, etc.) and can apply pressure to the rocker 410 to position the locking mechanism 408 in an enabled position (e.g., locked position, position to interact with a rack, etc.). That is, the spring mechanism 404 can comprise a material (e.g., aluminum, etc.) that can be in an arch-shape to apply a force to the rocker 410.

In some examples, rocker 410 can include a diecast material. The rocker 410 can be attached to the rail 416 via a cylindrical piece to enable the rocker 410 to change positions (e.g., enabled position to a disabled position, locked position to an unlocked position, etc.). The cylindrical piece can also enable pressure to be transferred from the spring mechanism 404 to the locking mechanism 408.

The rocker 410 and the locking mechanism 408 can comprise the same and/or similar material. In addition, the rocker 410 and the locking mechanism 408 can comprise a single piece of material. For example, the rocker 410 and the locking mechanism 408 can be a single piece of material that further comprises a button to adjust the position of the rocker 410 and locking mechanism 408.

Figure 5:
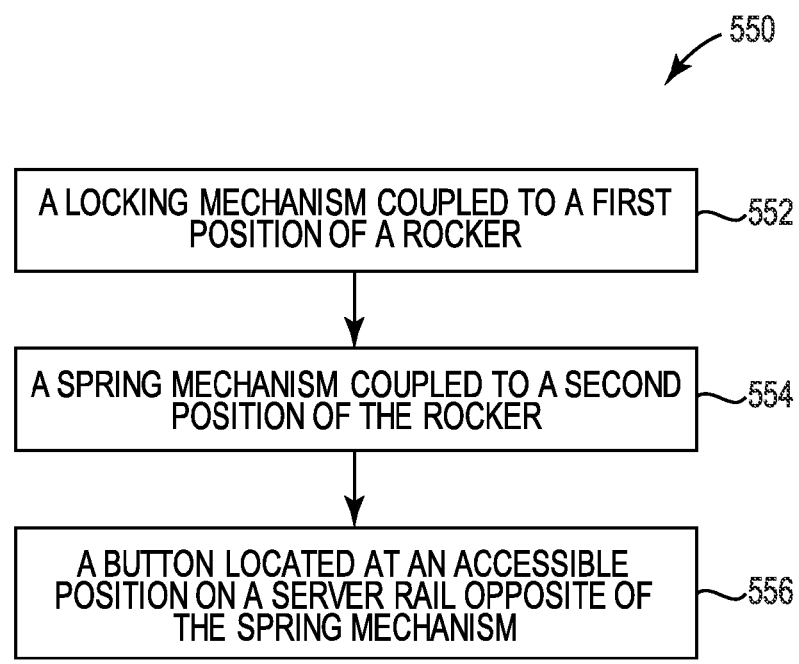
FIG. 5 illustrates an element diagram for an example of a release latch.

FIG. 5 illustrates an element diagram 550 for an example of a release latch. The element diagram 550 can include a number of elements that can be included with a release latch (e.g., release latch 100 as referenced in FIG. 1, release latch 200 as referenced in FIG. 2, release latch 300 as referenced in FIG. 3, and/or release latch 400 as referenced in FIG. 4). The release latch can include an increased or decreased number of elements compared to the elements shown in element diagram 550.

At box 552 the release latch can include a locking mechanism coupled to a first position of a rocker. As described herein, the locking mechanism can include a diecast material. In addition, the locking mechanism can be coupled to the first position of the rocker and/or be a diecast locking mechanism/rocker combination. That is, the locking mechanism and the rocker can be a single piece that includes a diecast material.

The rocker can include a cylindrical piece that can be attached to the server rail. The rocker can enable the release latch to move in a number of positions (e.g., locked position, unlocked position, intermediate positions). The rocker can be used as a pivot point between the locking mechanism and a spring mechanism. That is, the rocker can transfer pressure between the locking mechanism side of the release latch to the spring mechanism side of the release latch and vice versa.

At box 554 the release latch can include a spring mechanism coupled to a second position of the rocker. As described herein, the spring mechanism can be coupled to the rocker at a position that is different than the locking mechanism. The spring mechanism can apply pressure to the rocker and the rocker can transfer the applied pressure to the locking mechanism. The pressure applied to the locking mechanism can keep the locking mechanism in a locked position (e.g., position that interacts with the server rail, position that prevents the rail from being removed from the rack, etc.).

At box 556 the release latch can include a button located at an accessible position on a server rail opposite of the spring mechanism. As described herein, the button can be located at a position that is on the opposite side of the spring mechanism. The button can be used by a user to apply pressure to the spring mechanism. The applied pressure to the spring mechanism can change the position of the spring mechanism and change the pressure applied to the rocker. The change in pressure to the rocker can change the position of the locking mechanism and change the position of the locking mechanism. The changed position of the locking mechanism can be a change from a locked position to an unlocked position (e.g., position that does not interact with the server rail, position that enables a user to remove the server rail from the rack, etc.).

The button can be located at an accessible position for the user to access the button on the rail. As described herein, the button can be located on the inside view of the release latch (shown in FIG. 3). The button can be located at an accessible position when there are multiple other servers located within the same rack.

In one example, a server can have a first server rail attached to a first side of the server and a second server rail attached to a second side of the server. In addition, the server can be placed into the rack via the server rails on each side of the server and the server rails can lock into the rack via the locking mechanism on each rail interacting with the rack. There can be other servers locked within the rack by a similar means. The button on each rail can be accessed by a user when there are multiple other servers locked within the rack. The user can access the buttons on each rail and apply pressure to each button to change the position of the locking mechanisms on each rail to an unlocked position. The user can then remove the server attached to each rail without having to remove the other servers locked within the rack.

The specification examples provide a description of the applications and use of the system and method of the present disclosure. Since many examples can be made without departing from the spirit and scope of the system and method of the present disclosure, this specification sets forth some of the many possible example configurations and implementations.

What is claimed:

1. A release latch apparatus, comprising:
   a locking mechanism coupled to a first position of a rocker, wherein the locking mechanism allows the locking mechanism to bypass a server rack when the locking mechanism is in a disabled position;
   a spring mechanism to change the locking mechanism from the disabled position to an enabled position, wherein the spring mechanism is coupled to a second position of the rocker; and
   a button to change a position of the spring mechanism from the enabled position to the disabled position, wherein the button is located at an accessible position on a server rail opposite of the spring mechanism and wherein the button is coupled to the rocker by the spring mechanism.

2. The apparatus of claim 1, wherein the spring mechanism enables and disables the locking mechanism.

3. The apparatus of claim 1, wherein the button is accessed at an exterior position.

4. The apparatus of claim 1, wherein the spring mechanism is activated by applying pressure to the button connected to the spring mechanism.

5. The apparatus of claim 4, wherein applying pressure to the spring mechanism disables the locking mechanism.

6. The apparatus of claim 1, wherein the locking mechanism secures the server rail to the server rack.

7. A release latch system, comprising:
   a first release latch on a first server rail, wherein the first release latch includes a first locking mechanism that allows the first locking mechanism to bypass a server rack in a disabled position, a first spring mechanism to change a position of the first locking mechanism, and a first button located at an accessible position on the first server rail opposite of the first spring mechanism, wherein the first button is coupled to the first rocker by the first spring mechanism; and
   a second release latch on a second server rail, wherein the second release latch includes a second locking mechanism that allows the second locking mechanism to bypass a server rack in a disabled position, a second spring mechanism to change a position of the second locking mechanism, and a second button located at an accessible position on the second server rail opposite of the second spring mechanism, wherein the second button is coupled to the second rocker by the second spring mechanism, and
   wherein the first locking mechanism and the second locking mechanism are disabled to release a server attached to the first server rail and the second server rail.

8. The apparatus of claim 7, wherein the first locking mechanism is disabled to release the first server rail.

9. The apparatus of claim 7, wherein the second locking mechanism is disabled to release the second server rail.

10. The apparatus of claim 7, wherein the first and second locking mechanisms are disabled by applying pressure, via the first button, to the first spring mechanism and applying pressure, via the second button, to the second spring mechanism respectively.

11. A release latch system, comprising:
    a server rack that includes a plurality of server rails to position a plurality of servers;
    a first release latch located at a first position on a first server rail of the plurality of server rails, comprising:
       a first locking mechanism coupled to a first position of a rocker, wherein the locking mechanism allows the locking mechanism to bypass the sever rack in a disabled position; and
       a first spring mechanism to change the first locking mechanism from a disabled position to an enabled position, wherein the first spring mechanism is coupled to a second position of the rocker; a first button located at an accessible position on the first server rail opposite of the first spring mechanism, wherein the first button is coupled to the rocker by the first spring mechanism;
    a second release latch located at a second position on a second server rail of the plurality of server rails, comprising:
       a second locking mechanism coupled to a first position of a rocker, wherein the second locking mechanism allows the second locking mechanism to bypass a sever rack in a disabled position; and
       a second spring mechanism to change the second locking mechanism from the disabled position to an enabled position, wherein the second spring mechanism is coupled to a second position of the rocker; a second button located at an accessible position on the second server rail opposite of the second spring mechanism, wherein the second button is coupled to the rocker by the second spring mechanism.

12. The system of claim 11, wherein the first release latch and the second release latch are disabled to release a corresponding server from the plurality of servers.

13. The system of claim 11, wherein the release latch system locks each of the number of servers at a particular position within the server rack.

14. The system of claim 11, wherein the first release latch and the second release latch are attached to a first server of the plurality of servers and wherein the first server is between a second server and a third server of the plurality of servers.

15. The system of claim 14, wherein the second server is in a position that is above the first server and the third server is in a position that is below the first server.

* * * * *